(12) United States Patent  (10) Patent No.: US 6,607,072 B2
Bliven et al.  (45) Date of Patent: Aug. 19, 2003

(54) WHEEL AND CONVEYOR SYSTEM FOR TRANSPORTING SEMICONDUCTOR WAFERS

(75) Inventors: Brian M. Bliven, San Jose, CA (US); Michael Ravkin, Sunnyvale, CA (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 10/193,803

(22) Filed: Jul. 11, 2002

(65) Prior Publication Data

US 2002/0174881 A1 Nov. 28, 2002

Related U.S. Application Data

(62) Division of application No. 09/608,515, filed on Jun. 30, 2000, now Pat. No. 6,439,245.

(51) Int. Cl.[7] ............................................... B65G 13/12
(52) U.S. Cl. ........................ 198/782; 198/624; 198/790
(58) Field of Search ............................... 198/624, 782, 198/783, 790

(56) References Cited

U.S. PATENT DOCUMENTS

| | | | | |
|---|---|---|---|---|
| 1,940,526 A | * | 12/1933 | Berger | 198/624 |
| 2,580,469 A | * | 1/1952 | Schwartz | 198/624 |
| 3,830,355 A | * | 8/1974 | Verjux | 198/624 |
| 3,842,962 A | * | 10/1974 | Grachev et al. | 198/783 |
| 4,217,977 A | | 8/1980 | Tam | |
| 4,313,266 A | | 2/1982 | Tam | |
| 4,505,381 A | * | 3/1985 | Major | 198/783 |
| 5,924,154 A | | 7/1999 | Gockel et al. | |
| 6,021,791 A | | 2/2000 | Dryer et al. | |
| 6,179,113 B1 | * | 1/2001 | Wunscher et al. | 198/782 |

FOREIGN PATENT DOCUMENTS

WO  WO 99/04416  1/1999

* cited by examiner

Primary Examiner—Joseph E. Valenza
(74) Attorney, Agent, or Firm—Martine & Penilla, LLP

(57) ABSTRACT

A wheel for a conveyor system for transporting semiconductor wafers includes a first section for supporting a semiconductor wafer at a first level and a second section for supporting the wafer at a second level, with the first level being higher than the second level. In one embodiment, each of the first and second sections is semicircular. The first level may be substantially the same as a level at which the wafer is subjected to a wafer cleaning operation, and the distance the second level is below the first level may be in a range from about one sixteenth of an inch to about three sixteenths of an inch. A conveyor system for transporting wafers and a method for transferring wafers from a conveyor system to a wafer processing station also are described.

11 Claims, 9 Drawing Sheets

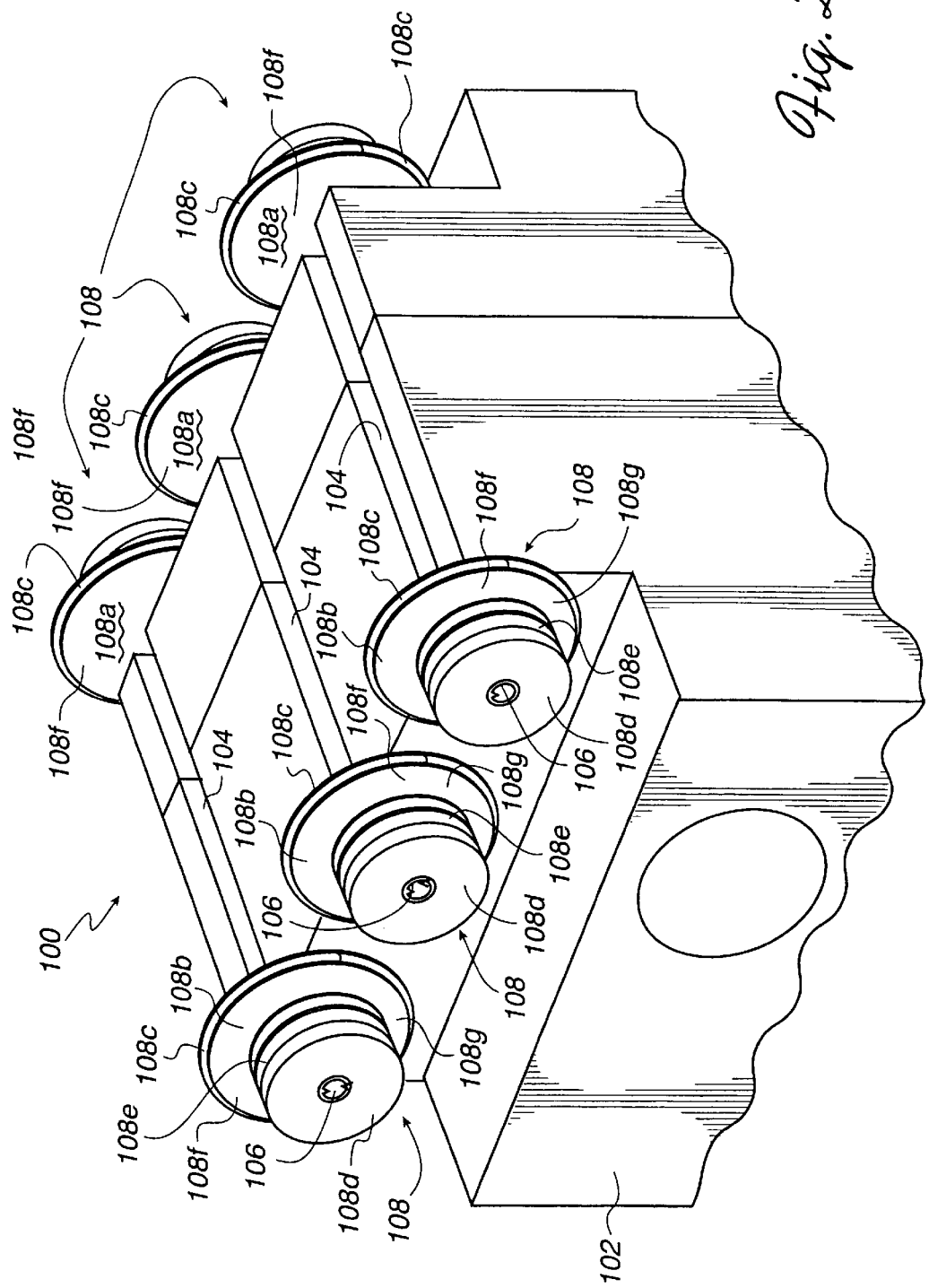

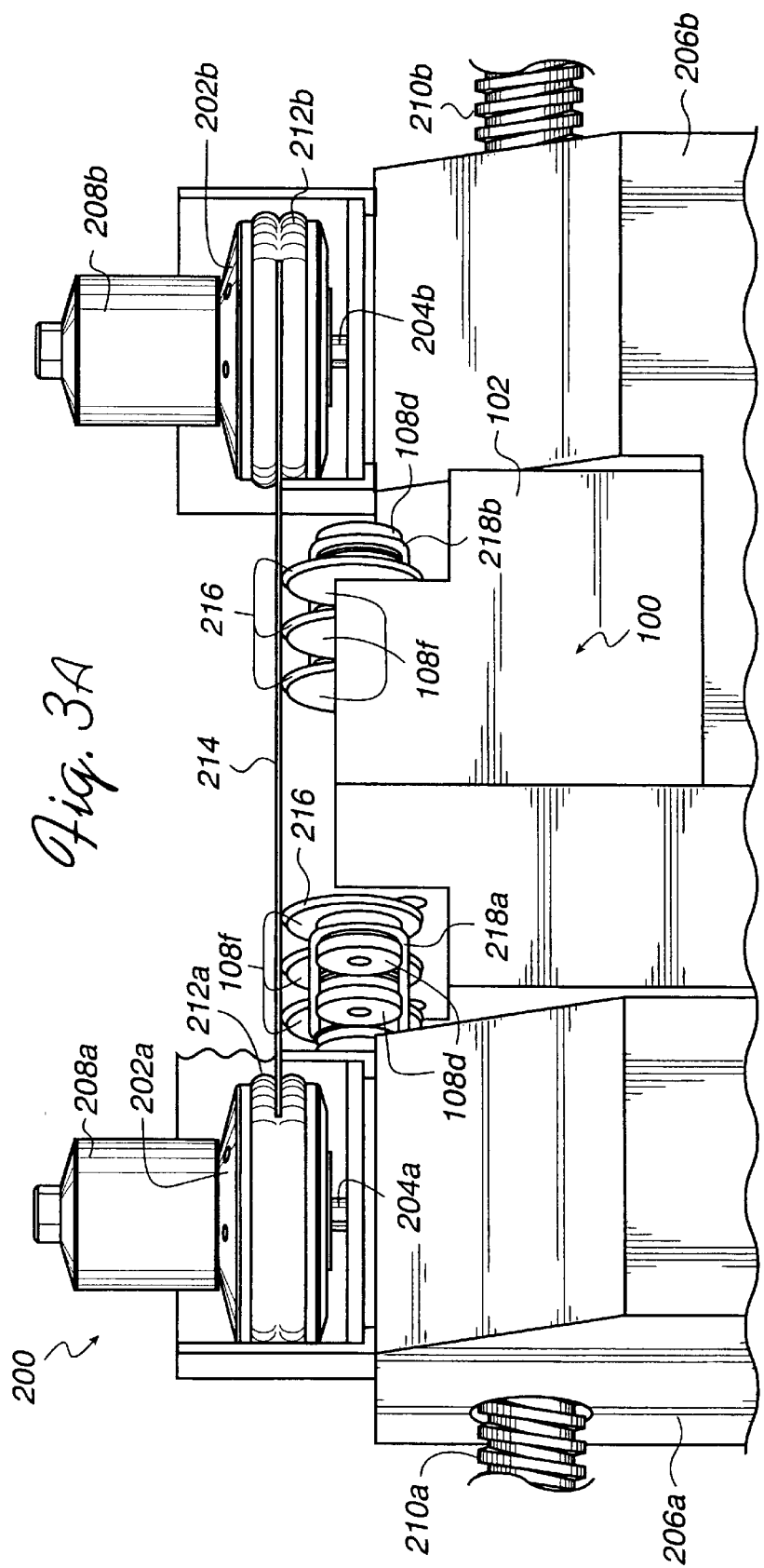

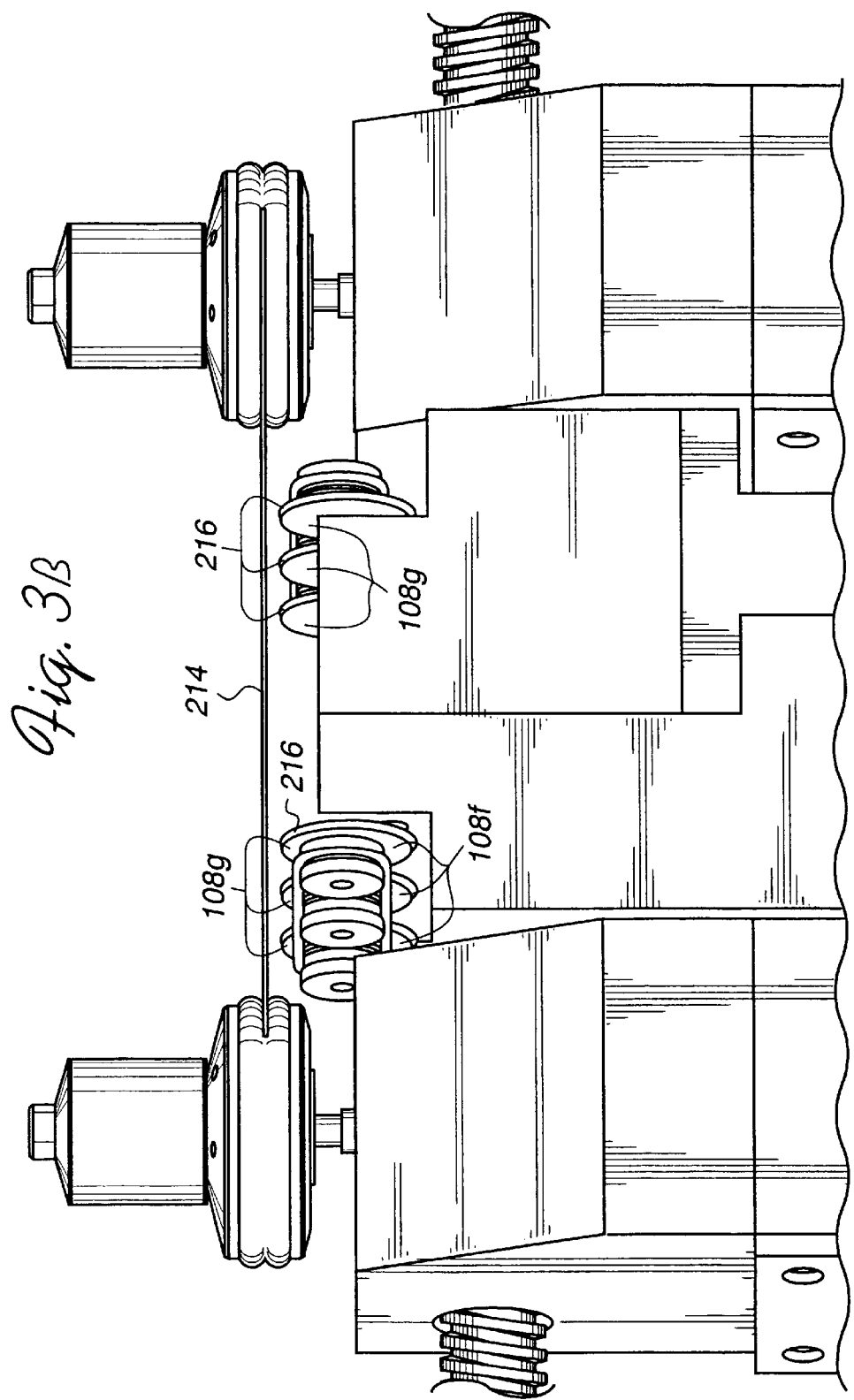

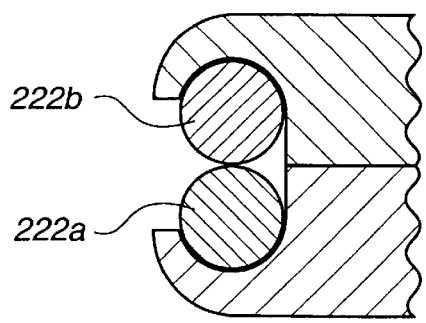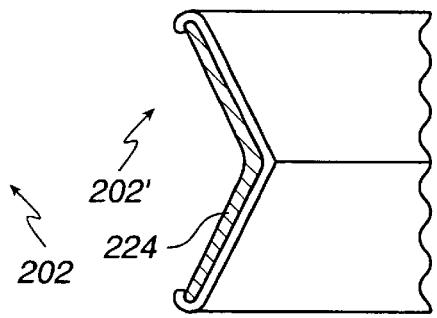
Fig. 3D          Fig. 3E
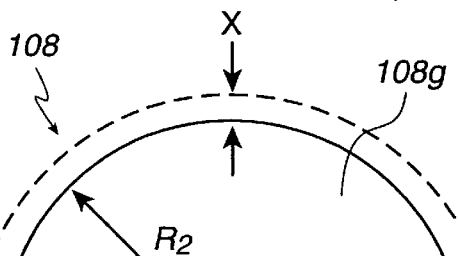
Fig. 4A
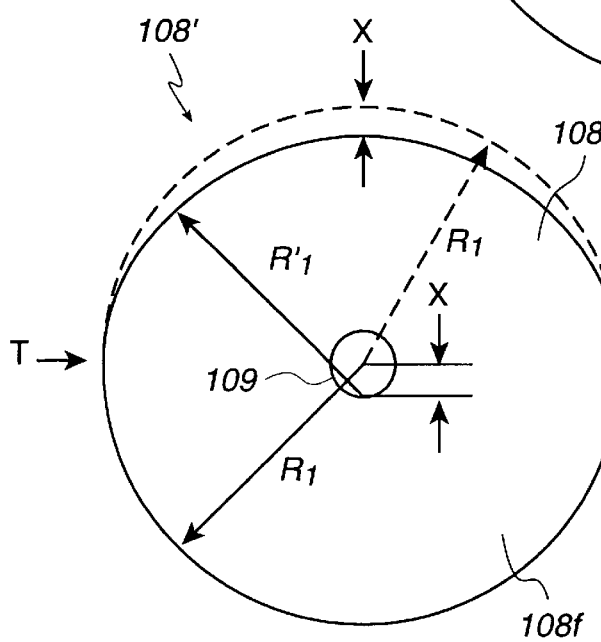
Fig. 4B

WHEEL AND CONVEYOR SYSTEM FOR TRANSPORTING SEMICONDUCTOR WAFERS

CROSS-REFERENCE TO RELATED APPLICATION

This application is a divisional of application Ser. No. 09/608,515, filed Jun. 30, 2000, now U.S. Pat. No. 6,439,245, the disclosure of which is incorporated herein by reference.

BACKGROUND OF THE INVENTION

The present invention relates generally to semiconductor fabrication and, more particularly, to a wheel for a conveyor system for transporting semiconductor wafers, a conveyor system for transporting wafers, and a method for transferring wafers from a conveyor system to a wafer processing station.

In the fabrication of semiconductor devices, a variety of wafer preparation operations are performed. FIG. 1 is a schematic diagram of a conventional wafer cleaning system 50. The cleaning system 50 includes a load station 10 where a plurality of wafers in a cassette 14 may be inserted into the system for cleaning. Once the wafers are inserted into the load station 10, a wafer 12 may be taken from the cassette 14 and moved into a brush station 16, which includes a first brush box 16a and a second brush box 16b. The wafer 12 is first moved into first brush box 16a, where the wafer is scrubbed in a solution containing specified chemicals and deionized (DI) water. The wafer 12 is then moved into second brush box 16b, where the wafer is again scrubbed in a solution containing specified chemicals and DI water. After the wafer 12 has been scrubbed in brush boxes 16a and 16b, the wafer is moved into a spin, rinse, and dry (SRD) station 20 where DI water is sprayed onto the top and bottom surfaces of the wafer as the wafer is spun. After the wafer 12 has been dried, the wafer is moved from SRD station 20 to an unload station 22.

To achieve the best throughput productivity in wafer cleaning system 50, wafer 12 must be rapidly and efficiently transported from first brush box 16a to second brush box 16b. In comparison with a conveyor system, a robotic "pick and place" system is a slow and inefficient way to transport a wafer from the first brush box to the second brush box. Conventional conveyor systems, however, suffer from the drawback that they are capable of transporting wafers only in a horizontal plane. Consequently, these conveyor systems do not interface efficiently with the equipment, e.g., edge clamp devices, that handles a wafer during processing because either the wafer or the track must be moved to obtain the clearance required to process the wafer.

In view of the foregoing, there is a need for a device that efficiently transports a wafer through a wafer processing station such as, for example, a wafer cleaning system having a first brush box and a second brush box.

SUMMARY OF THE INVENTION

Broadly speaking, the present invention fills this need by providing a conveyor system that supports and transports a wafer, yet can be readily moved to separate from the wafer during processing. The present invention also provides a wheel for the conveyor system and a method for transferring a wafer from a conveyor system to a wafer processing station.

In accordance with one aspect of the present invention, a wheel for a conveyor system for transporting semiconductor wafers is provided. The wheel includes a first section for supporting a semiconductor wafer at a first level and a second section for supporting the wafer at a second level, with the first level being higher than the second level. In one embodiment, each of the first and second sections is semicircular. In one embodiment, the first level is substantially the same as a level at which the wafer is subjected to a wafer cleaning operation, and the distance the second level is below the first level is in a range from about one sixteenth of an inch to about three sixteenths of an inch.

In accordance with another aspect of the present invention, a conveyor system for transporting semiconductor wafers is provided. The conveyor system includes a plurality of wheels arranged to transport a semiconductor wafer from a first location to a second location. At least some of the wheels have a first semicircular section for supporting the wafer at a first level and a second semicircular section for supporting the wafer at a second level, with the first level being higher than the second level. In one embodiment, the first location is a first brush box and the second location is a second brush box. In one embodiment, the wheels having the first and second semicircular sections are disposed proximate to a wafer processing station such as, for example, a brush box.

In accordance with yet another aspect of the present invention, a method for transferring a semiconductor wafer from a conveyor system to a wafer processing station is provided. In this method, the wheels of a conveyor system are rotated so that a semiconductor wafer being transported by the conveyor system arrives at a wafer processing station substantially at a level at which the wafer is to be processed in the wafer processing station. Next, the wafer is clamped with edge clamp devices as the wheels of the conveyor system support the wafer. The wheels of the conveyor system are then rotated to move the wheels out of contact with the wafer. The wafer may then be subjected to a wafer processing operation as the wafer is clamped in the edge clamp devices.

In one embodiment, the wafer processing station is a brush box and the wafer processing operation is a cleaning operation. In one embodiment, the edge clamp devices are disposed on wafer rotation rollers. In one embodiment, at least some of the wheels are dual radius wheels having a first section with a first radius and a second section with a second radius, the second radius being configured to provide clearance between the second section and the semiconductor wafer. In this embodiment, the operation of rotating the wheels of the conveyor system so that the semiconductor wafer arrives at the wafer processing station substantially at the level at which the semiconductor wafer is to be processed in the wafer processing station includes controllably rotating at least some of the dual radius wheels so that the first sections thereof support the wafer. In this embodiment, the operation of rotating the wheels of the conveyor system to move the wheels out of contact with the wafer includes controllably rotating the dual radius wheels so that the second sections thereof provide clearance between the dual radius wheels and the wafer.

The conveyor system of the present invention may be integrated into wafer processing stations to provide highly efficient transport of the wafers through the wafer processing stations. In particular, the dual radius wheels of the present invention enable the conveyor system to support the wafer at two distinct levels. Thus, the conveyor system of the present invention is capable of not only transporting the wafers rapidly from station to station, but also of efficiently moving clear of the wafers for processing. Consequently, the conveyor system of the present invention advantageously helps to maximize throughput productivity in a wafer cleaning system.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

FIG. 2A is a simplified perspective view of a conveyor system with dual radius wheels in the "wheels up" position in accordance with one embodiment of the invention.

FIG. 3A is a simplified elevational view of a wafer processing station including a conveyor system in accordance with one embodiment of the invention.

FIG. 3B is a simplified elevational view of the wafer processing station shown in FIG. 3A after the conveyor system has been moved clear of the wafer for processing in accordance with one embodiment of the invention.

FIGS. 3D and 3E show simplified cross-sectional views of two exemplary edge clamp devices that may be used to clamp the edge of the wafer.

FIG. 4A is a simplified schematic diagram that shows an exemplary configuration of a dual radius wheel in accordance with one embodiment of the invention.

FIG. 4B is a simplified schematic diagram that shows an exemplary configuration of a dual radius wheel in accordance with another embodiment of the invention.

DETAILED DESCRIPTION OF THE INVENTION

Figure 1:
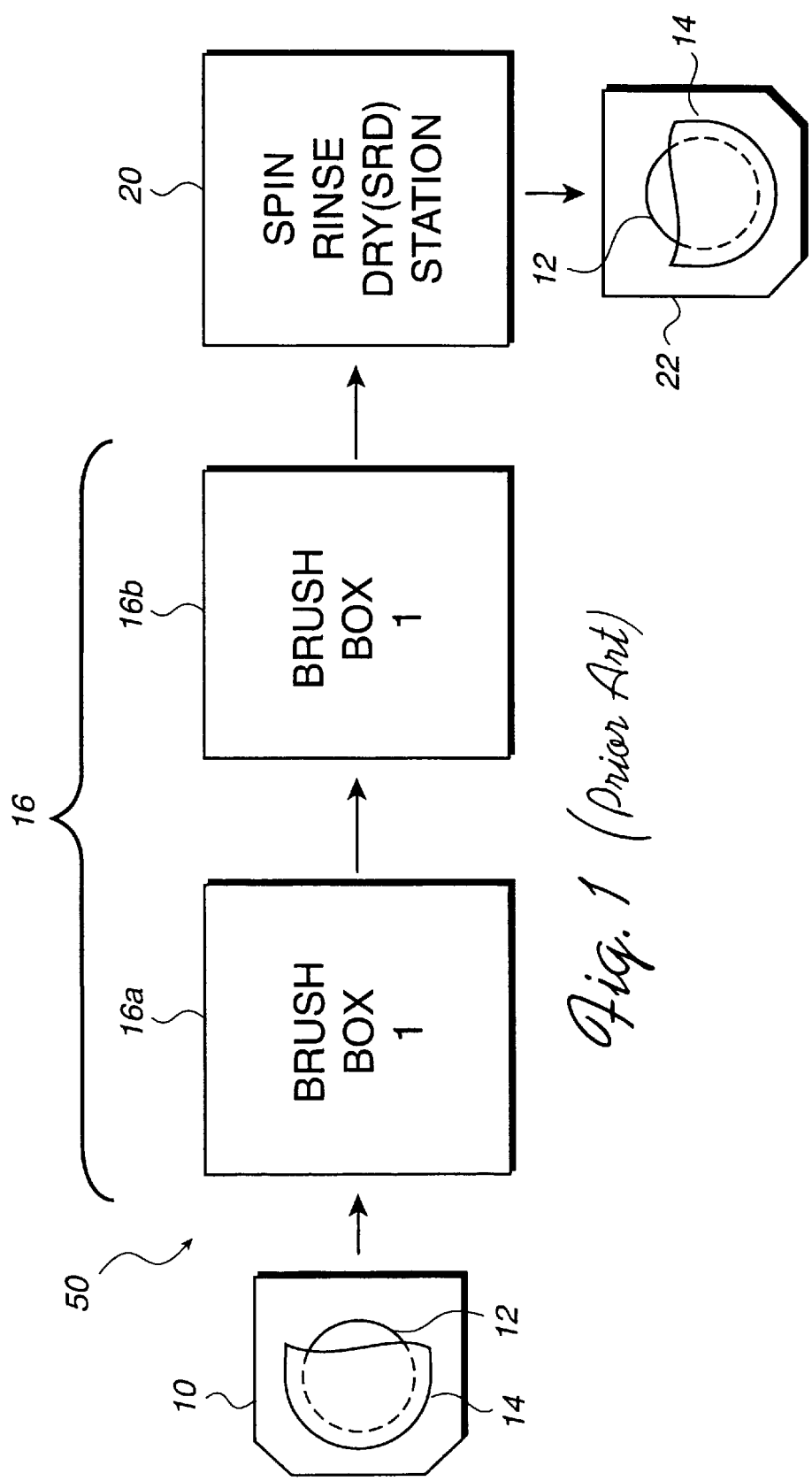
FIG. 1 is a schematic diagram of a conventional wafer cleaning system.

Several exemplary embodiments of the invention will now be described in detail with reference to the accompanying drawings. FIG. 1 is discussed above in the "Background of the Invention" section.

FIG. 2A is a simplified perspective view of conveyor system 100 in accordance with one embodiment of the invention. As shown therein, conveyor system 100 includes support stand 102 that has grooves 104 formed in a top surface thereof. Axles 106, which have dual radius wheels 108 mounted on the ends thereof, are disposed in grooves 104. Each of dual radius wheels 108 has inner surface 108a, outer surface 108b, and edge surface 108c, which extends between inner surface 108a and outer surface 108b and is configured to receive an O-ring for contacting a semiconductor wafer, as explained in more detail below. Hub 108d, which has groove 108e formed therein, is provided on outer surface 108b. Groove 108e is configured to receive a timing belt for rotating dual radius wheels 108 in unison.

Figure 2B:
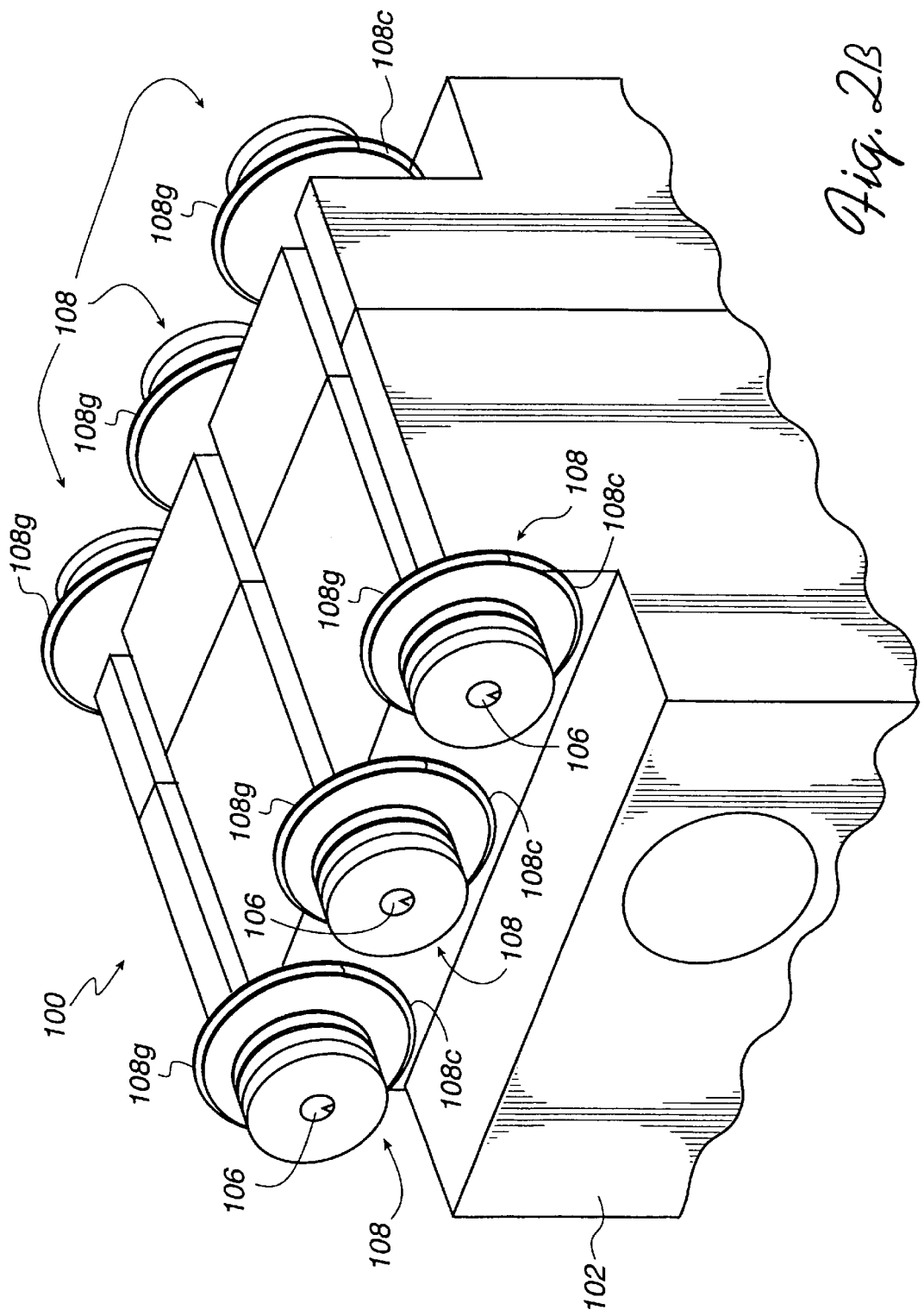
FIG. 2B is a simplified perspective view of the conveyor system shown in FIG. 2A after the dual radius wheels have been rotated so that they are in the "wheels down" position in accordance with one embodiment of the invention.

Each of dual radius wheels 108 has first semicircular section 108f for supporting a wafer at a first level and second semicircular section 108g for supporting the wafer at a second level, which is lower than the first level. As shown in FIG. 2A, dual radius wheels 108 are in the "wheels up" position in which first semicircular sections 108f face in an upward direction. In this position, first semicircular sections 108f support the wafer at a first level for processing, as described in more detail below. FIG. 2B is a simplified perspective view of conveyor system 100 shown in FIG. 2A after dual radius wheels 108 have been rotated so that they are in the "wheels down" position. As shown in FIG. 2B, second semicircular sections 108g face in an upward direction. In this position, second semicircular sections 108g may either support the wafer or provide clearance between the wafer and dual radius wheels 108 during processing, as will be described in more detail later.

Figure 2C:
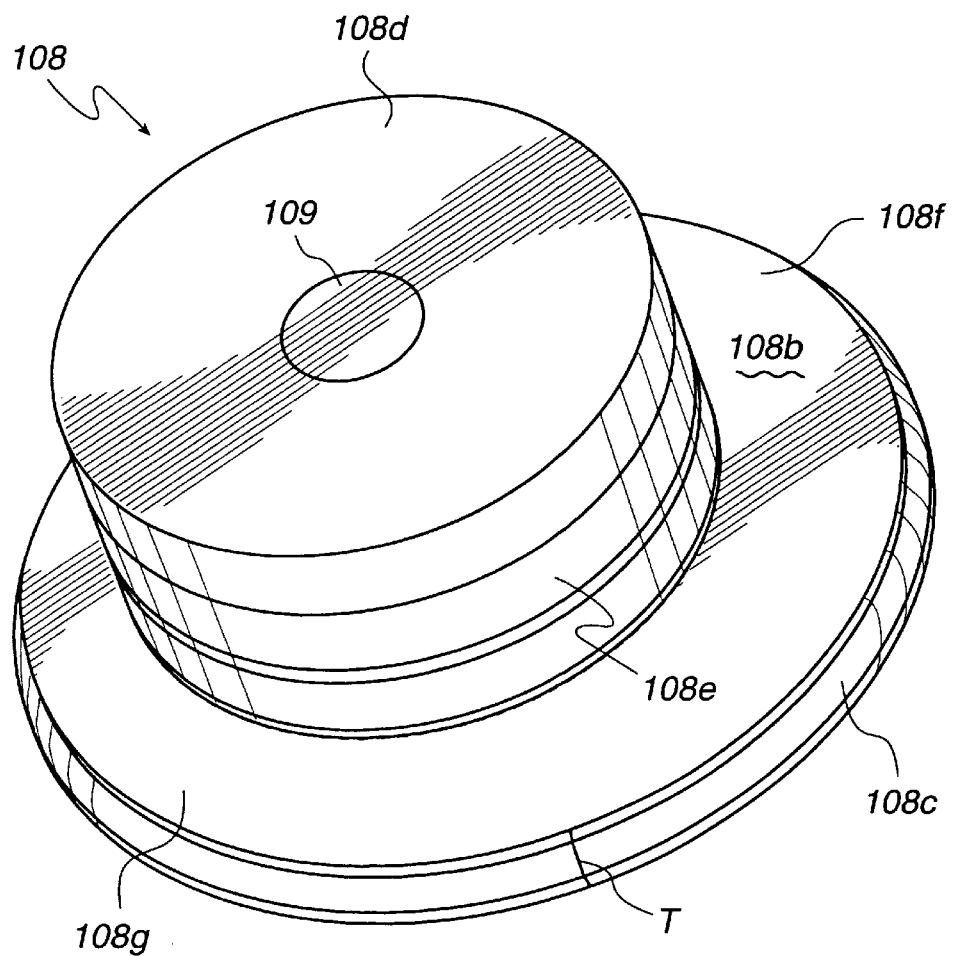
FIG. 2C is an enlarged perspective view of a dual radius wheel in accordance with one embodiment of the invention.

FIG. 2C is an enlarged perspective view of a dual radius wheel in accordance with one embodiment of the invention. As shown in FIG. 2C, dual radius wheel 108 includes hub 108d provided on outer surface 108b. Hub 108d has groove 108e formed therein for receiving a timing belt, as described above. Edge surface 108c extends between outer surface 108b and inner surface 108a (see FIGS. 2A and 2B) and defines a groove for receiving an O-ring that contacts the wafer. Central aperture 109 extends through dual radius wheel 108 and is configured to receive an axle. The transition between first semicircular section 108f and second semicircular section 108g occurs at points T (only one of which is visible in FIG. 2C). In one embodiment, each of first semicircular section 108f and second semicircular section 108g defines an arc that spans about 180 degrees. Dual radius wheel 108, as well as the other components of the conveyor system, may be formed of well-known materials that are suitable for use in a semiconductor processing environment in which cleaning chemicals are used.

FIG. 3A is a simplified elevational view of a wafer processing station including a conveyor system in accordance with one embodiment of the invention. As shown therein, wafer processing station 200 includes wafer rotation rollers 202a and 202b, which are mounted on shafts 204a and 204b, respectively. Shafts 204a and 204b extend into gear housings 206a and 206b, respectively, which enclose the drive mechanisms for rotating wafer rotation rollers 202a and 202b. Height adjustment knobs 208a and 208b for adjusting the height of wafer rotation rollers 202a and 202b, respectively, are provided on shafts 204a and 204b, respectively. Lead screws 210a and 210b provide lateral movement of gear housings 206a and 206b, respectively, so that the lateral position of wafer rotation rollers 202a and 202b can be adjusted. Edge clamp devices 212a and 212b for clamping the edge of semiconductor wafer 214 are disposed on wafer rotation rollers 202a and 202b, respectively. Additional details of two exemplary edge clamp devices are described below with reference to FIGS. 3D and 3E.

As shown in FIG. 3A, first semicircular sections 108f of dual radius wheels 108 (see, e.g., FIGS. 2A and 2B) of conveyor system 100 support wafer 214 at the level at which the wafer will be processed in wafer processing station 200. More particularly, O-rings 216, which are disposed in edge surface 108c (see, e.g., FIG. 2C) of each dual radius wheel 108, contact the backside of wafer 214 and thereby support the wafer. As shown in FIG. 3A, conveyor system 100 includes three pairs of dual radius wheels 108, with each pair of wheels being arranged in an opposing relationship on opposite sides of support stand 102. Timing belt 218a rotates the set of dual radius wheels 108 situated on the left side of support stand 102 and timing belt 218b rotates the set of wheels situated on the right side of the support stand. Timing belts 218a and 218b are disposed in grooves 108e formed in hubs 108d, as shown, for example, in FIG. 2A.

FIG. 3B is a simplified elevational view of wafer processing station 200 shown in FIG. 3A after conveyor system 100 has been moved clear of wafer 214 for processing in accordance with one embodiment of the invention. As shown in FIG. 3B, dual radius wheels 108 have been rotated so that second semicircular sections 108g face in an upward direction toward the backside of wafer 214. Second semicircular section 108g is configured to provide sufficient clearance for safely processing wafer 214. Consequently, when second semicircular sections 108g are positioned as shown in FIG. 3B, a gap is defined between the outer surfaces of O-rings 216 disposed on dual radius wheels 108 and the backside of wafer 214. In one embodiment, second semicircular section 108g is configured such that the gap, i.e., the distance between the outer surfaces of O-rings 216 and the backside of wafer 214, is in the range from about one sixteenth (1/16) of an inch to about three sixteenths (3/16) of an inch, with the range from about one eighth (1/8) of an inch to about three sixteenths (3/16) of an inch being preferred. The configuration of second semicircular section 108g is discussed in more detail below with reference to FIGS. 4A and 4B.

It will be apparent to those skilled in the art that the center-to-center spacing of dual radius wheels 108 of conveyor system 100 must be selected to ensure that wafer 214 is adequately supported as the wafer advances along the conveyor system. Generally speaking, for 8-inch wafers, the center-to-center spacing should not exceed about 3.6 inches. For 12-inch wafers, the center-to-center spacing should not exceed about 5.5 inches.

Figure 3C:
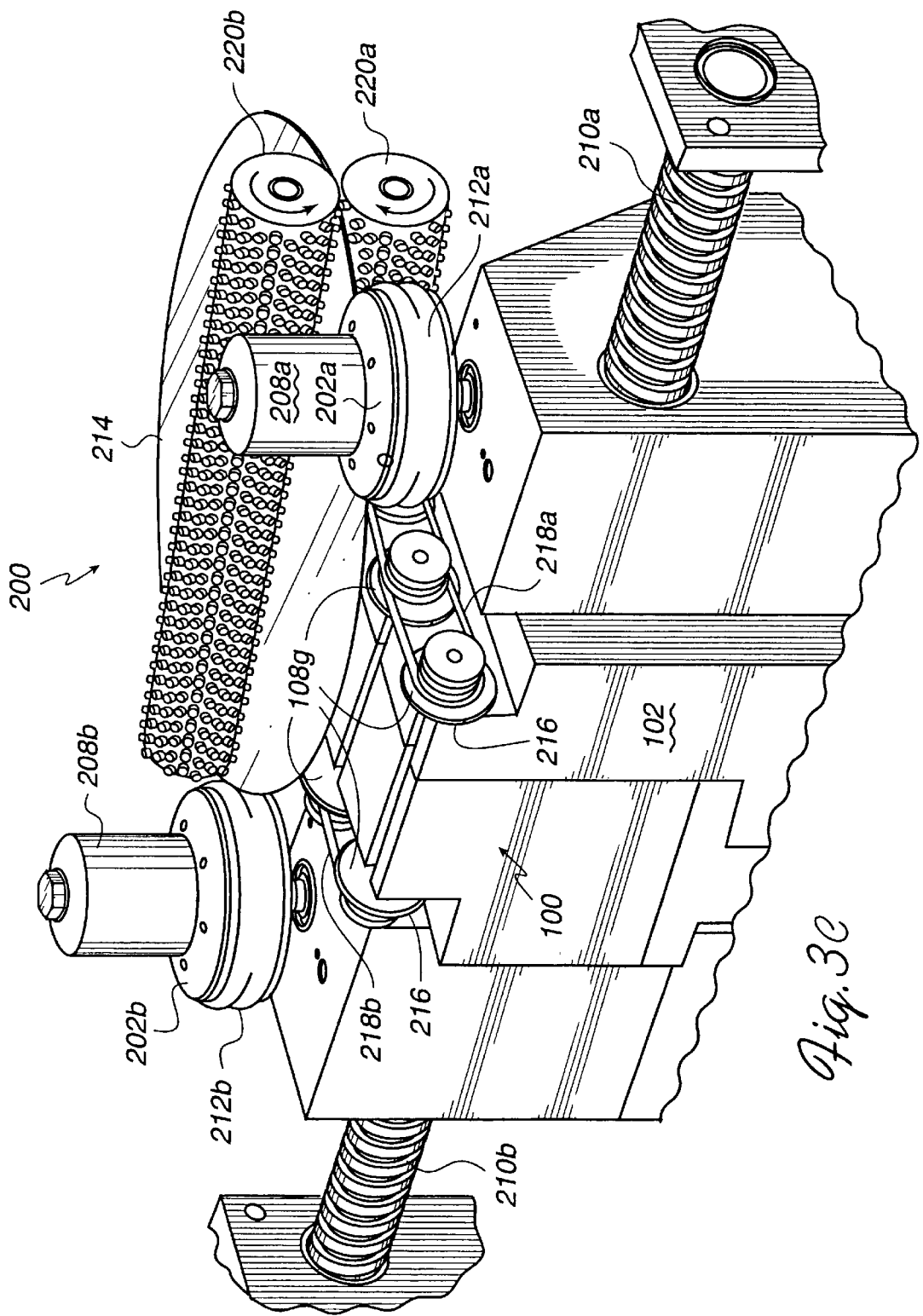
FIG. 3C is a simplified elevational view of the wafer processing station shown in FIG. 3B as the wafer is being subjected to a wafer cleaning operation in accordance with one embodiment of the invention.

FIG. 3C is a simplified elevational view of wafer processing station 200 shown in FIG. 3B as wafer 214 is being subjected to a wafer cleaning operation in accordance with one embodiment of the invention. As shown in FIG. 3C, wafer processing station 200 is a brush box in which wafer 214 is being cleaned by rotating brushes 220a and 220b. The arrows in FIG. 3C indicate the respective directions in which lower brush 220a and upper brush 220b rotate during cleaning. With dual radius wheels 108 of conveyor system 100 rotated out of contact with wafer 214 as described above in connection with FIG. 3B, the wafer is otherwise supported in the process plane for the cleaning operation. In particular, edge clamp devices 212a and 212b, which are disposed on wafer rotation rollers 202a and 202b, respectively, and lower brush 220a support wafer 214 in the process plane for cleaning.

FIGS. 3D and 3E show simplified cross-sectional views of two exemplary edge clamp devices that may be used to clamp the edge of the wafer. FIG. 3D shows a double O-ring edge clamp device including O-rings 222a and 222b disposed around wafer rotation roller 202. FIG. 3E shows a polyurethane pad edge clamp device in which polyurethane pad 224 is supported in a V-shaped groove defined in wafer rotation roller 202'.

FIG. 4A is a simplified schematic diagram that shows an exemplary configuration of dual radius wheel 108 in accordance with one embodiment of the invention. As shown in FIG. 4A, first semicircular section 108f has radius $R_1$ and second semicircular section 108g has radius $R_2$, which is shorter than radius $R_1$. The difference between radius $R_1$ and radius $R_2$ is a distance, X, that corresponds to a desired clearance for wafer processing, i.e., the distance between the outer surfaces of O-rings 216 and the backside of wafer 214 when second semicircular section 108g faces in an upward direction (see FIG. 3B). The transition between first semicircular section 108f and second semicircular section 108g occurs at points T. In this exemplary configuration, the outer surface of each of first semicircular section 108f and second semicircular section 108g defines an arc that spans about 180 degrees. Consequently, transition points T are spaced around dual radius wheel 108 by about 180 degrees.

FIG. 4B is a simplified schematic diagram that shows an exemplary configuration of dual radius wheel 108' in accordance with another embodiment of the invention. As shown in FIG. 4B, first semicircular section 108f has radius $R_1$. Second semicircular section 108g has radius $R_1'$, which has the same length as radius $R_1$ but does not originate at the center of dual radius wheel 108. Instead, radius $R_1'$ originates at a point that is offset from the center of dual radius wheel 108 by a distance, X, that corresponds to a desired maximum clearance for wafer processing. When second semicircular section 108g' faces in an upward direction such that points T define a horizontal plane, the clearance provided by dual radius wheel 108' is the same as that provided by dual radius wheel 108 shown in FIG. 4A. In contrast with the constant clearance provided by second semicircular section 108g of dual radius wheel 108, second semicircular section 108g' of dual radius wheel 108' provides a variable clearance. The maximum clearance occurs when second semicircular section 108g' faces in an upward direction such that points T define a horizontal plane. The clearance decreases as dual radius wheel 108' is rotated away from the point of maximum clearance and reaches a minimum at the point at which points T define a vertical plane. Consequently, the transitions at points T between first semicircular section 108f and second semicircular section 108g' of dual radius wheel 108' are smoother than the corresponding transitions in dual radius wheel 108 shown in FIG. 4A.

Figure 5:
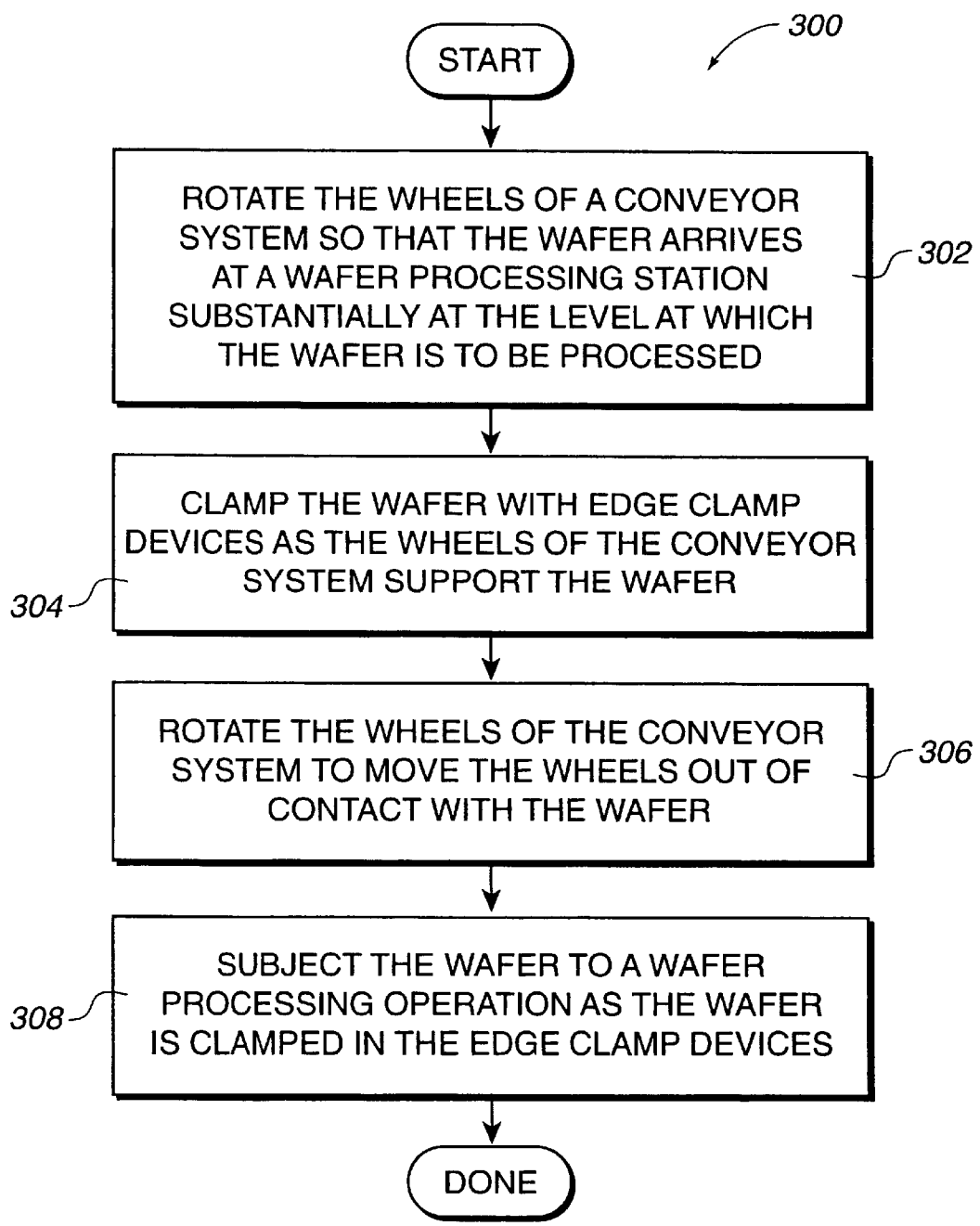
FIG. 5 is a flowchart diagram illustrating the method operations performed in transferring a semiconductor wafer from a conveyor system to a wafer processing station in accordance with one embodiment of the invention.

FIG. 5 is a flowchart diagram 300 illustrating the method operations performed in transferring a semiconductor wafer from a conveyor system to a wafer processing station in accordance with one embodiment of the invention. The method begins in operation 302 in which the wheels of a conveyor system are rotated so that the wafer arrives at a wafer processing station substantially at the level at which the wafer is to be processed in the wafer processing station. By way of example, this may be accomplished by using a conveyor system having a plurality of wheels at least some of which are the dual radius wheels described herein. In one embodiment, a number of the dual radius wheels of the conveyor system are controllably rotated so that the first sections thereof support the wafer as the wafer arrives at the wafer processing station. In one embodiment, the wafer processing station is a brush box and the wafer processing operation is a cleaning operation.

In operation 304, the wafer is clamped with edge clamp devices as the wheels of the conveyor system support the wafer. In one embodiment, the edge clamp devices are disposed on wafer rotation rollers. To facilitate the edge clamping process, it may be desirable to time the rotation of the wheels so that the wafer arrives at the wafer processing station just past the top height of the wheels. When the wheels are timed in this manner, the wafer may be clamped by the edge clamp devices without having the O-rings disposed on the wheels creating skid marks on the backside of the wafer. Once the wafer is edge clamped, the method proceeds to operation 306 in which the wheels of the conveyor system are rotated to move the wheels out of contact with the wafer. In one embodiment, a number of the dual radius wheels of the conveyor system are controllably rotated so that the second sections thereof provide clearance between the dual radius wheels and the wafer. After the wheels have been moved clear of the wafer, in operation 308, the wafer is subjected to a wafer processing operation as the wafer is clamped in the edge clamp devices. Once the wafer processing operation is complete, the method is done.

The wheel, conveyor system, and method of the present invention are well suited for transporting a wafer in a wafer cleaning system from a first brush box to a second brush box. By way of example, a conveyor system of the invention may be provided in the wafer cleaning system between the first and second brush boxes. At the outset, the wafer may be placed at the process position in the first brush box by robotic handoff to edge clamp devices that clamp the edge of the wafer and hold the wafer during processing. Before the wafer is processed in the first brush box, the wheels of the conveyor system may be controllably rotated to a position at which the wheels clear the wafer. The wafer may then be processed in the first brush box. Once this processing is complete, the wheels of the conveyor system may be controllably rotated to a position at which the wheels support the wafer. The edge clamp devices may then be released so that the wafer rests on the wheels of the conveyor system.

At this point, the wheels of the conveyor system may be rotated to transport the wafer from the first brush box to the second brush box. As the wafer advances along the conveyor system, the wafer is alternately supported by the first and second sections of the dual radius wheels. Consequently, the wafer tilts up and down in a wave-like manner as it advances along the conveyor system. The rotation of the wheels of the conveyor system may be timed so that the wafer is either at or just beyond the peak position of the wafer transport path as the wafer arrives at the second brush box. The wafer may then be edge clamped for processing in the second brush box. Before the wafer is processed in the second brush box, the wheels of the conveyor system may be controllably rotated to a position at which the wheels clear the wafer. To support serial wafer processing at peak efficiency, the action in the second brush box should occur simultaneously with the action in the first brush box.

In summary, the present invention provides a wheel for a conveyor system for transporting semiconductor wafers, a conveyor system for transporting wafers, and a method for transferring wafers from a conveyor system to a wafer processing station. The invention has been described herein in terms of several exemplary embodiments. Other embodiments of the invention will be apparent to those skilled in the art from consideration of the specification and practice of the invention. For example, the relatively small conveyor system described herein for transporting wafers within a wafer cleaning system from a first brush box to a second brush box may be expanded to provide a conveyor system that is capable of transporting wafers through the entire wafer cleaning system. The embodiments and preferred features described above should be considered exemplary, with the scope of the invention being defined by the appended claims and their equivalents.

What is claimed is:

1. A wheel for a conveyor system for transporting semiconductor wafers, comprising:

an inner surface, an outer surface, and an edge surface extending between the inner surface and the outer surface, the outer surface having a hub provided thereon, the hub having a groove formed therein for receiving a drive belt, and the edge surface being configured to receive an O-ring for contacting a semiconductor wafer;

a first section for supporting the semiconductor wafer at a first level; and a second section for supporting the semiconductor wafer at a second level, the first level being higher than the second level.

2. The wheel of claim 1, wherein each of the first and second sections is semicircular.

3. A conveyor system for transporting semiconductor wafers, comprising:

a plurality of wheels arranged to transport a semiconductor wafer from a first location a second location, at least some of the wheels being dual radius wheels having a first semicircular section for supporting the semiconductor wafer at a first level and a second semicircular section for supporting the semiconductor wafer at a second level, the first level being higher than the second level, wherein each of the dual radius wheels has an inner surface, an outer surface, and an edge surface extending between the inner surface and the outer surface, the outer surface having a hub provided thereon, the hub having a groove formed therein for receiving a drive belt, and the edge surface being configured to receive an O-ring for contacting the semiconductor wafer.

4. The conveyor system of claim 3, wherein the first location is a first brush box and the second location is a second brush box.

5. The wheel of claim 1, wherein each of the first and second sections is semicircular, the first section has a first radius and the second section has a second radius, and the first radius is longer than the second radius by a distance in a range from about one sixteenth of an inch to about three sixteenths of an inch.

6. The wheel of claim 5, wherein the first radius is longer than the second radius by a distance in a range from about one eighth of an inch to about three sixteenths of an inch.

7. The conveyor system of claim 3, wherein the first semicircular section of each dual radius wheel has a first radius and the second semicircular section of each dual radius wheel has a second radius, the first radius being longer than the second radius by a distance in a range from about one sixteenth of an inch to about three sixteenths of an inch.

8. The conveyor system of claim 7, wherein the first radius is longer than the second radius by a distance in a range from about one eighth of an inch to about three sixteenths of an inch.

9. A dual radius wheel for a conveyor system for transporting semiconductor wafers, comprising:

an inner surface, an outer surface, and an edge surface extending between the inner surface and the outer surface, the outer surface having a hub provided thereon, the hub having a groove formed therein for receiving a drive belt, and the edge surface being configured to receive an O-ring for contacting a semiconductor wafer;

a first semicircular section having a first radius; and a second semicircular section having a second radius, wherein a difference between the first radius and the second radius corresponds to a desired clearance for wafer processing.

10. The dual radius wheel of claim 9, wherein the difference between the first radius and the second radius is in a range from about one sixteenth of an inch to about three sixteenths of an inch.

11. The dual radius wheel of claim 9, wherein the difference between the first radius and the second radius is in a range from about one eighth of an inch to about three sixteenths of an inch.

* * * * *